(12) United States Patent
Wang et al.

(10) Patent No.: US 10,027,417 B2
(45) Date of Patent: Jul. 17, 2018

(54) OPTICAL SIGNAL MODULATION APPARATUS AND SYSTEM

(71) Applicant: Huawei Technologies Co., Ltd., Shenzhen (CN)

(72) Inventors: Yin Wang, Shenzhen (CN); Lei Gao, Shenzhen (CN); Yanbo Li, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 15/461,263

(22) Filed: Mar. 16, 2017

(65) Prior Publication Data

US 2017/0195058 A1    Jul. 6, 2017

Related U.S. Application Data

(63) Continuation of application No. PCT/CN2014/086741, filed on Sep. 17, 2014.

(51) Int. Cl.
*H04B 10/516* (2013.01)
*H04B 10/50* (2013.01)
*H04B 10/58* (2013.01)

(52) U.S. Cl.
CPC ......... *H04B 10/516* (2013.01); *H04B 10/503* (2013.01); *H04B 10/58* (2013.01)

(58) Field of Classification Search
CPC ..... H04B 10/503; H04B 10/516; H04B 10/58
USPC ........................................................ 398/183
See application file for complete search history.

(56) References Cited

U.S. PATENT DOCUMENTS

| | | |
|---|---|---|
| 5,394,261 A | 2/1995 | Nakamura |
| 6,381,056 B1 | 4/2002 | Ellis |
| 7,433,549 B2 | 10/2008 | Doerr et al. |
| 7,680,364 B2 | 3/2010 | Nilsson et al. |
| 8,116,635 B2 | 2/2012 | Tanimura et al. |
| 8,270,847 B2 | 9/2012 | Zhang et al. |
| 8,417,126 B2 | 4/2013 | Mandai et al. |
| 2004/0101016 A1* | 5/2004 | McDonald .......... H01S 5/02248 372/97 |
| 2006/0104321 A1* | 5/2006 | He ........................ H01S 5/0265 372/26 |

(Continued)

FOREIGN PATENT DOCUMENTS

| | | |
|---|---|---|
| CN | 1185254 A | 6/1998 |
| CN | 201061080 A | 5/2008 |

(Continued)

*Primary Examiner* — Dalzid Singh
(74) *Attorney, Agent, or Firm* — Leydig Voit & Mayer, Ltd.

(57) ABSTRACT

Embodiments of the present invention provide an optical signal modulation apparatus and system. The optical signal modulation apparatus includes: a laser, where each of at least one first output end and at least one second output end of the laser is connected to an electro-absorption modulator (EAM), the laser is configured to generate at least two optical signals, where at least one of the optical signals is sent to at least one EAM by using the at least one first output end, and at least one of the optical signals is sent to at least one EAM by using the at least one second output end, and each EAM is configured to modulate a received electrical signal onto the received optical signal for outputting. The apparatus has a simple structure and less complex production.

10 Claims, 5 Drawing Sheets

(56) References Cited

U.S. PATENT DOCUMENTS

| | | |
|---|---|---|
| 2010/0290489 A1 | 11/2010 | Agresti et al. |
| 2010/0303469 A1* | 12/2010 | Barton ................ H04B 10/505 398/184 |
| 2011/0157670 A1 | 6/2011 | Koch |
| 2014/0133868 A1 | 5/2014 | Krause et al. |
| 2015/0333475 A1* | 11/2015 | Blumenthal ......... H04B 10/505 372/20 |

FOREIGN PATENT DOCUMENTS

| | | |
|---|---|---|
| CN | 101517938 A | 8/2009 |
| CN | 103399418 A | 11/2013 |
| JP | H04132428 A | 5/1992 |
| JP | H06120616 A | 4/1994 |
| JP | H11214801 A | 8/1999 |
| JP | 2012156336 A | 8/2012 |
| WO | 2014107537 A1 | 7/2014 |

\* cited by examiner

OPTICAL SIGNAL MODULATION APPARATUS AND SYSTEM

CROSS-REFERENCE TO RELATED APPLICATIONS

This application is a continuation of International Application No. PCT/CN2014/086741, filed on Sep. 17, 2014, the disclosure of which is hereby incorporated by reference in its entirety.

TECHNICAL FIELD

Embodiments of the present invention relate to the field of optical communications technologies, and in particular, to an optical signal modulation apparatus and system.

BACKGROUND

With development of an information industry, especially with emergence of a data center, an optical communications system for high-speed data transmission is an inevitable development trend.

In an optical communications network, to load channel data carried in an electrical signal onto an optical signal for transmission, a laser is usually used to generate a beam of light. The electrical signal is modulated on the beam of light by a modulator, and sent to a fiber for transmission. An electro-absorption modulator (EAM) is a simple, cheap, and widely-used modulator. As shown in FIG. 1, an apparatus for loading two electrical signals onto two optical signals by using two EAMs is used to increase a communications capacity of an optical communications system. This apparatus includes three structures: a laser, a passive waveguide, and an EAM. The laser is configured to generate a laser ray, and needs a laminar structure that can ensure a largest gain. The passive waveguide is configured to divide an optical signal generated by the laser into two optical signals, and needs a laminar structure that can ensure a smallest splitting loss. The EAM is configured to modulate an electrical signal to one of the optical signals, and needs a laminar structure that can ensure optimal modulation performance. The three structures need to be implemented by using three different laminar structures, and each laminar structure needs an epitaxial growth. Therefore, this apparatus needs to undergo at least three epitaxial growths in a manufacturing process, and production is highly complex.

SUMMARY

Embodiments of the present invention provide an optical signal modulation apparatus and system, to resolve a prior-art problem of highly complex production.

A first aspect of the embodiments of the present invention provides an optical signal modulation apparatus, including:
a laser, where each of at least one first output end and at least one second output end of the laser is connected to an electro-absorption modulator (EAM), the first output end of the laser is disposed on one side of the laser, and the second output end is disposed on the other side of the laser;
the laser is configured to generate at least two optical signals, where at least one of the optical signals is sent to at least one EAM by using the at least one first output end, and at least one of the optical signals is sent to at least one EAM by using the at least one second output end; and
each EAM is configured to receive one electrical signal that carries channel data, receive one of the optical signals sent by the laser, and modulate the received electrical signal onto the received optical signal for outputting.

With reference to the first aspect, in a first possible implementation manner of the first aspect, the apparatus further includes at least one optical reflection apparatus, and one optical reflection apparatus is connected to an output end of an EAM connected to one first output end; and
each optical reflection apparatus is configured to reflect one optical signal that is output at the first output end, so that the reflected optical signal is in a same direction as an optical signal that is output at the second output end.

With reference to the first possible implementation manner of the first aspect, in a second possible implementation manner of the first aspect, the optical reflection apparatus includes a first reflection prism and a second reflection prism;
the first reflection prism is configured to reflect, to the second reflection prism, the one optical signal that is output at the first output end; and
the second reflection prism is configured to re-reflect the optical signal reflected by the first reflection prism, so that the re-reflected optical signal is in the same direction as the optical signal that is output at the second output end.

With reference to the second possible implementation manner of the first aspect, in a third possible implementation manner of the first aspect, the optical reflection apparatus further includes a first glass component and a second glass component;
the first glass component is configured to provide an optical channel between the first reflection prism and the second reflection prism; and
the second glass component is configured to output, by using the optical channel, the optical signal reflected by the second reflection prism.

With reference to either the second or the third possible implementation manner of the first aspect, in a fourth possible implementation manner of the first aspect, the apparatus further includes:
at least one optical path compensation component, where one optical path compensation component is connected to an output end of an EAM connected to one second output end, and each optical path compensation component is configured to perform optical path compensation on one optical signal that is output at the second output end, so that a compensated optical signal is synchronized with the optical signal that is reflected by the optical reflection apparatus and that is output at the first output end.

With reference to the fourth possible implementation manner of the first aspect, in a fifth possible implementation manner of the first aspect, the optical path compensation component includes:
a third reflection prism, a fourth reflection prism, a fifth reflection prism, a sixth reflection prism, a third glass component, a fourth glass component, a fifth glass component, and a sixth glass component, where
the third glass component, the third reflection prism, the fourth glass component, the fourth reflection prism, the fifth reflection prism, the fifth glass component, the sixth reflection prism, and the sixth glass component are connected in sequence, the third glass component is connected to the output end of the EAM connected to the second output end, and the sixth glass component is configured to output the optical signal obtained after optical path compensation; and a total length of a transmission path of an optical signal in the third reflection prism, the fourth reflection prism, the fifth reflection prism, the sixth reflection prism, the third glass component, the fourth glass component, the fifth glass component, and the sixth glass component is a sum of lengths of the laser and two EAMs.

With reference to any one of the first to the fifth possible implementation manners of the first aspect, in a sixth possible implementation manner of the first aspect, a convex lens is disposed between an output end of an EAM connected to each first output end and each optical reflection apparatus, and the convex lens is configured to focus an optical signal that is output at the output end of the EAM connected to each first output end, and input the focused optical signal to a corresponding optical reflection apparatus.

With reference to any one of the first aspect, or the first to the sixth possible implementation manners of the first aspect, in a seventh possible implementation manner of the first aspect, a convex lens is disposed between each output end of the laser and a corresponding EAM, and the convex lens is configured to focus an optical signal that is output at the output end of the laser, and input the focused optical signal to the corresponding EAM.

A second aspect of the embodiments of the present invention provides an optical signal modulation system, including: the optical signal modulation apparatus according to any one of the first aspect, or the possible implementation manners of the first aspect, an optical polarization rotator, and an optical polarization beam combiner (PBC);

the optical signal modulation apparatus is configured to generate at least two optical signals, and modulate each of at least two received electrical signals that carry channel data to one of the optical signals for outputting;

the optical polarization rotator is configured to perform polarization rotation processing on at least one optical signal that is output by the optical signal modulation apparatus, and output a processed optical signal to the PBC, where the at least one optical signal is at least one of the at least two optical signals; and the PBC is configured to combine the optical signal that is processed by the optical polarization rotator and an optical signal that is not processed by the optical polarization rotator and that is output by the optical signal modulation apparatus, and input the combined optical signal to a fiber.

With reference to the second aspect, in a first possible implementation manner of the second aspect, the system further includes: at least one convex lens, disposed between an output end at which the optical signal modulation apparatus outputs the at least one optical signal and the optical polarization rotator, where each convex lens is configured to focus the at least one optical signal that is output by the optical signal modulation apparatus, and input the focused optical signal to the optical polarization rotator.

With reference to either the second aspect or the first possible implementation manner of the second aspect, in a second possible implementation manner of the second aspect, the system further includes:

a reflection prism, configured to reflect, to the PBC, the optical signal that is processed by the optical polarization rotator or the optical signal that is not processed by the optical polarization rotator and that is output by the optical signal modulation apparatus.

According to the optical signal modulation apparatus in the embodiments of the present invention, each of at least one first output end and at least one second output end of a laser is connected to an EAM; the first output end of the laser is disposed on one side of the laser, and the second output end is disposed on the other side of the laser; the laser generates at least two optical signals, where at least one of the optical signals is sent to at least one EAM by using the at least one first output end, and at least one of the optical signals is sent to at least one EAM by using the at least one second output end; and each EAM receives one electrical signal that carries channel data, receives one of the optical signals sent by the laser, and modulates the received electrical signal onto the received optical signal for outputting. On the basis of modulating each of at least two electrical signals that carry channel data to one optical signal for outputting, the optical signal modulation apparatus in the embodiments of the present invention has a simple apparatus structure, includes only two structures (the laser and the EAM), and needs to undergo only two epitaxial growths in a manufacturing process. Therefore, the apparatus in the embodiments of the present invention has less complex production. For actual production, product yields may be increased greatly, and unit costs may be reduced.

BRIEF DESCRIPTION OF DRAWINGS

To describe the technical solutions in the embodiments of the present invention or in the prior art more clearly, the following briefly describes the accompanying drawings for describing the embodiments or the prior art. The accompanying drawings in the following description show some embodiments of the present invention, and persons of ordinary skill in the art may still derive other drawings from these accompanying drawings without creative efforts.

DESCRIPTION OF EMBODIMENTS

To make the objectives, technical solutions, and advantages of the embodiments of the present invention clearer, the following clearly describes the technical solutions in the embodiments of the present invention with reference to the accompanying drawings in the embodiments of the present invention.

Figure 1:
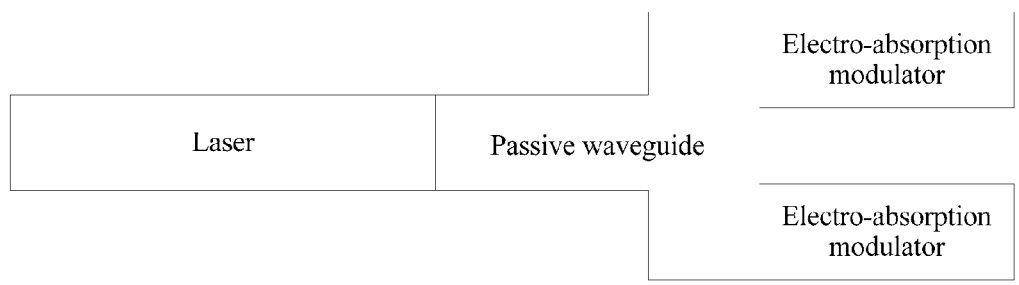
FIG. 1 shows an apparatus for loading two electrical signals onto two optical signals by using one laser.
Figure 2A:
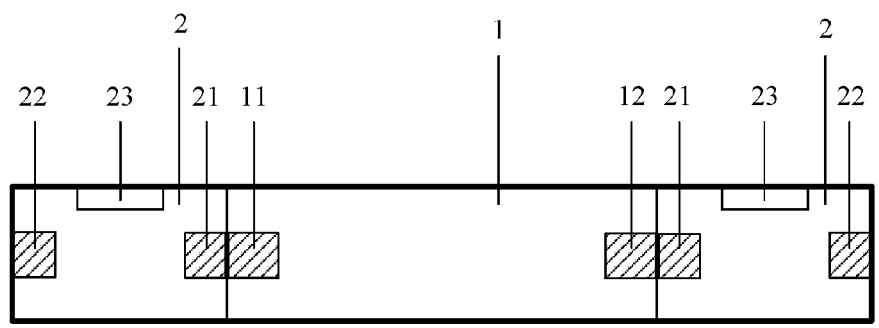
FIG. 2A is a schematic structural diagram of Embodiment 1 of an optical signal modulation apparatus according to the present invention.
Figure 2B:
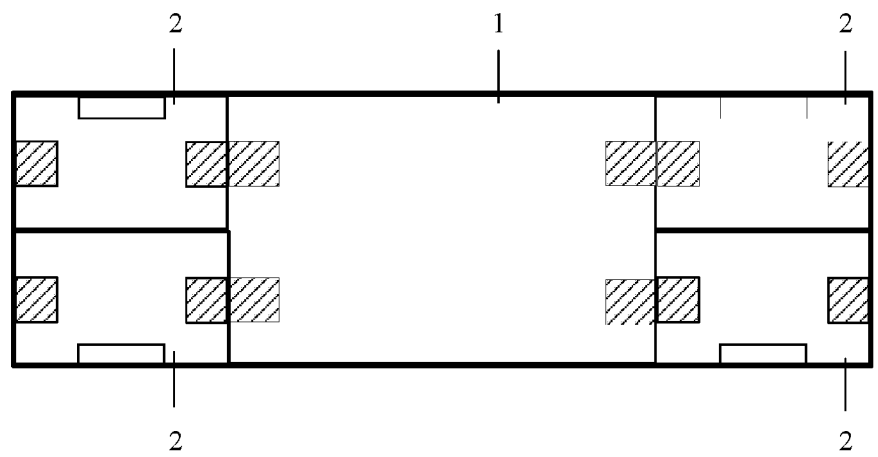
FIG. 2B is another schematic structural diagram of Embodiment 1 of an optical signal modulation apparatus according to the present invention.
Figure 2C:
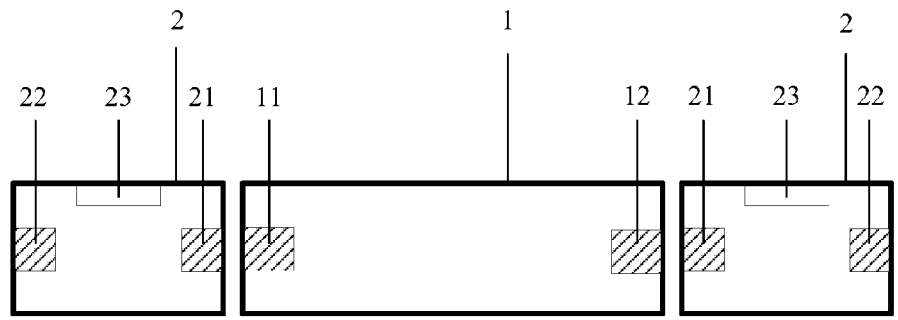
FIG. 2C is a third schematic structural diagram of Embodiment 1 of an optical signal modulation apparatus according to the present invention.
Figure 2D:
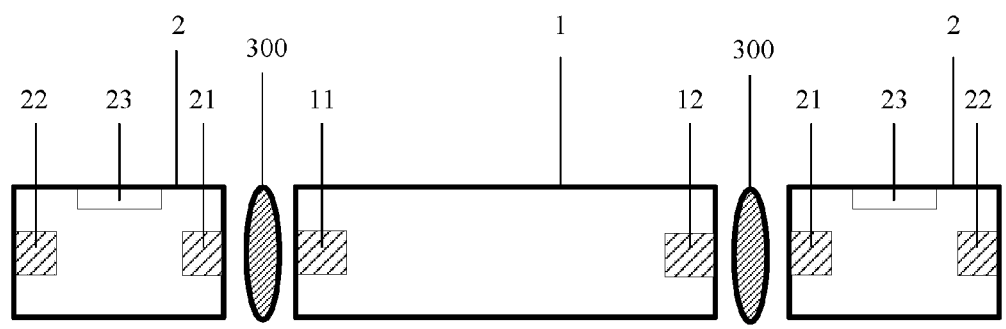
FIG. 2D is a fourth schematic structural diagram of Embodiment 1 of an optical signal modulation apparatus according to the present invention.

FIG. 2A is a schematic structural diagram of Embodiment 1 of an optical signal modulation apparatus according to the present invention. FIG. 2B is another schematic structural diagram of Embodiment 1 of an optical signal modulation apparatus according to the present invention. FIG. 2C is a third schematic structural diagram of Embodiment 1 of an optical signal modulation apparatus according to the present invention. FIG. 2D is a fourth schematic structural diagram of Embodiment 1 of an optical signal modulation apparatus according to the present invention.

As shown in FIG. 2A, the apparatus in this embodiment may include a laser 1 and electro-absorption modulators (EAMs) 2 that are connected to each of at least one first output end 11 and at least one second output end 12 of the laser 1. The first output end 11 of the laser 1 is disposed on one side of the laser, and the second output end 12 is disposed on the other side of the laser.

The laser 1 is configured to generate at least two optical signals, where at least one of the optical signals is sent to at least one EAM by using the at least one first output end, and at least one of the optical signals is sent to at least one EAM by using the at least one second output end.

Each EAM 2 is configured to receive one electrical signal that carries channel data, receive one of the optical signals sent by the laser, and modulate the received electrical signal onto the received optical signal for outputting.

For example, the laser 1 generates two optical signals, one of the optical signals is sent to one EAM by using one first output end 11, and the other optical signal is sent to one EAM by using the second output end 12. Each EAM includes an optical signal input end 21, an optical signal output end 22, and an electrical signal input end 23. Each EAM may use the electrical signal input end 23 to receive an electrical signal that carries channel data, use the optical signal input end 21 to receive one optical signal of the at least two optical signals generated by the laser 1, modulate the received electrical signal to the optical signal, and output the modulated optical signal by using the optical signal output end 22, so that the two electrical signals that carry the channel data are modulated to the two optical signals for outputting. Optical signals that are output by the EAMs connected to the first output end 11 and the second output end 12 may separately connect fibers on two sides, and modulated optical signals are separately input to fibers on the side of the first output end 11 and on the side of the second output end 12 for transmission. A quantity of fibers on either side may be one, or may be the same as a quantity of EAMs on the same side.

Optionally, there may be one or more first output ends 11 of the laser 1, and there may be one or more second output ends, as shown in FIG. 2B. Optionally, a quantity of first output ends 11 and a quantity of second output ends 12 may be the same, or may be different. This is not limited in the present invention.

It should be noted that in this embodiment of the present invention, the laser 1 and one EAM 2 that is connected to each of the at least one first output end 11 and the at least one second output end 12 of the laser 1 may be integrated in a chip in a manner of monolithic integration, so as to modulate data of one or more electrical signals. Alternatively, data of multiple electrical signals may be modulated in a combined manner by using separate chips, that is, the laser 1 and at least two EAMs use separate chips and coupled lenses to modulate data of multiple electrical signals. Optical signal modulation apparatuses implemented by using the foregoing different manners shall fall within the protection scope of the present invention, as shown in FIG. 2C.

Optionally, when the laser 1 and the at least two EAMs use separate chips, a convex lens 300 is disposed between each output end of the laser 1 and a corresponding EAM, and the convex lens 300 is configured to focus an optical signal that is output at the output end of the laser, and input the focused optical signal to the corresponding EAM, as shown in FIG. 2D.

Optionally, the laser 1 may be a laser chip structure implemented by being integrated into a chip, such as a distributed feedback laser (DFB).

According to the optical signal modulation apparatus in this embodiment of the present invention, each of at least one first output end and at least one second output end of a laser is connected to an EAM; the laser generates at least two optical signals, where at least one of the optical signals is sent to at least one EAM by using the at least one first output end, and at least one of the optical signals is sent to at least one EAM by using the at least one second output end; and each EAM receives one electrical signal that carries channel data, receives one of the optical signals sent by the laser, and modulates the received electrical signal onto the received optical signal for outputting. On the basis of modulating each of at least two electrical signals that carry channel data to one optical signal for outputting, the optical signal modulation apparatus in this embodiment of the present invention has a simple apparatus structure, includes only two functional crystal structures required separately by the laser and the EAM, and needs to undergo only two epitaxial growths in a manufacturing process. Therefore, the apparatus in this embodiment of the present invention has less complex production. For actual production, product yields are definitely high, and unit costs are reduced.

In addition, for a short-range optical communications system, fiber costs are relatively low, but power consumption and costs of a laser are relatively high. The optical signal modulation apparatus in this embodiment of the present invention may decrease a quantity of lasers, and reduce power consumption and costs of the optical communications system. In particular, for connection inside or between optical communications chips, the decreased quantity of lasers may reduce power consumption and costs of the optical communications chips.

Figure 3:
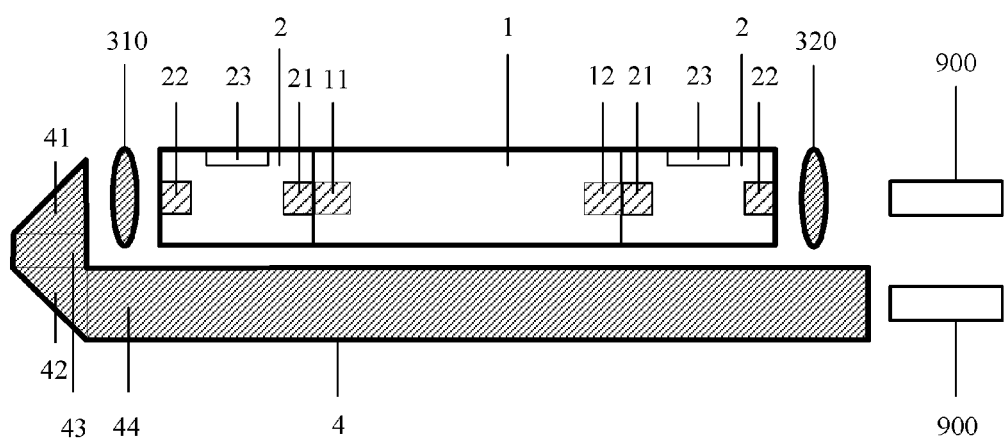
FIG. 3 is a schematic structural diagram of Embodiment 2 of an optical signal modulation apparatus according to the present invention.

FIG. 3 is a schematic structural diagram of Embodiment 2 of an optical signal modulation apparatus according to the present invention.

As shown in FIG. 3, on the basis of the apparatus structures shown in FIG. 2A to FIG. 2D, the apparatus in this embodiment may further include at least one optical reflection apparatus 4, and one optical reflection apparatus 4 is connected to an output end of an EAM connected to one first output end.

Each optical reflection apparatus 4 is configured to reflect one optical signal that is output at the first output end 11, so that the reflected optical signal is in a same direction as an optical signal that is output at the second output end 12.

It should be noted that FIG. 3 shows a structure of the optical signal modulation apparatus in which the laser includes one first output end, one second output end, and one optical reflection apparatus. If there is more than one first output end, a quantity of optical reflection apparatuses 4 may be equal to a quantity of first output ends 11. Further, an optical signal that is reflected by at least one optical reflection apparatus 4 and that is output by the EAM connected to the second output end 12 may be input to at least two fibers 900 for transmission, or may be input to one fiber for transmission.

Optionally, a convex lens 310 is disposed between an output end of an EAM connected to each first output end 11 and each optical reflection apparatus 4, and the convex lens 310 is configured to focus an optical signal that is output at the output end of the EAM connected to each first output end 11, and input the focused optical signal to a corresponding optical reflection apparatus 4.

For example, the optical reflection apparatus 4 may include a first reflection prism 41 and a second reflection prism 42.

The first reflection prism 41 is configured to reflect, to the second reflection prism 42, an optical signal that is output at the first output end 11.

The second reflection prism 42 is configured to re-reflect the optical signal reflected by the first reflection prism 41, so that the re-reflected optical signal is in a same direction as the optical signal that is output at the second output end 12.

Optionally, the optical reflection apparatus 4 may further include a first glass component 43 and a second glass component 44.

The first glass component 43 is configured to provide an optical channel between the first reflection prism and the second reflection prism.

The second glass component 44 is configured to output, by using the optical channel, the optical signal reflected by the second reflection prism.

Optionally, the first glass component 43 and the second glass component 44 may not be mandatory components. A vacuum part may be used to provide an optical channel, and a technical effect of the vacuum part is similar to that of a glass component. Details are not described herein.

In this embodiment, the at least one optical reflection apparatus 4 is used for optical reflection, and one optical reflection apparatus 4 is connected to an output end of an EAM connected to one first output end, so that the at least two optical signals may be output in the same direction, convenient for engineering use.

Figure 4:
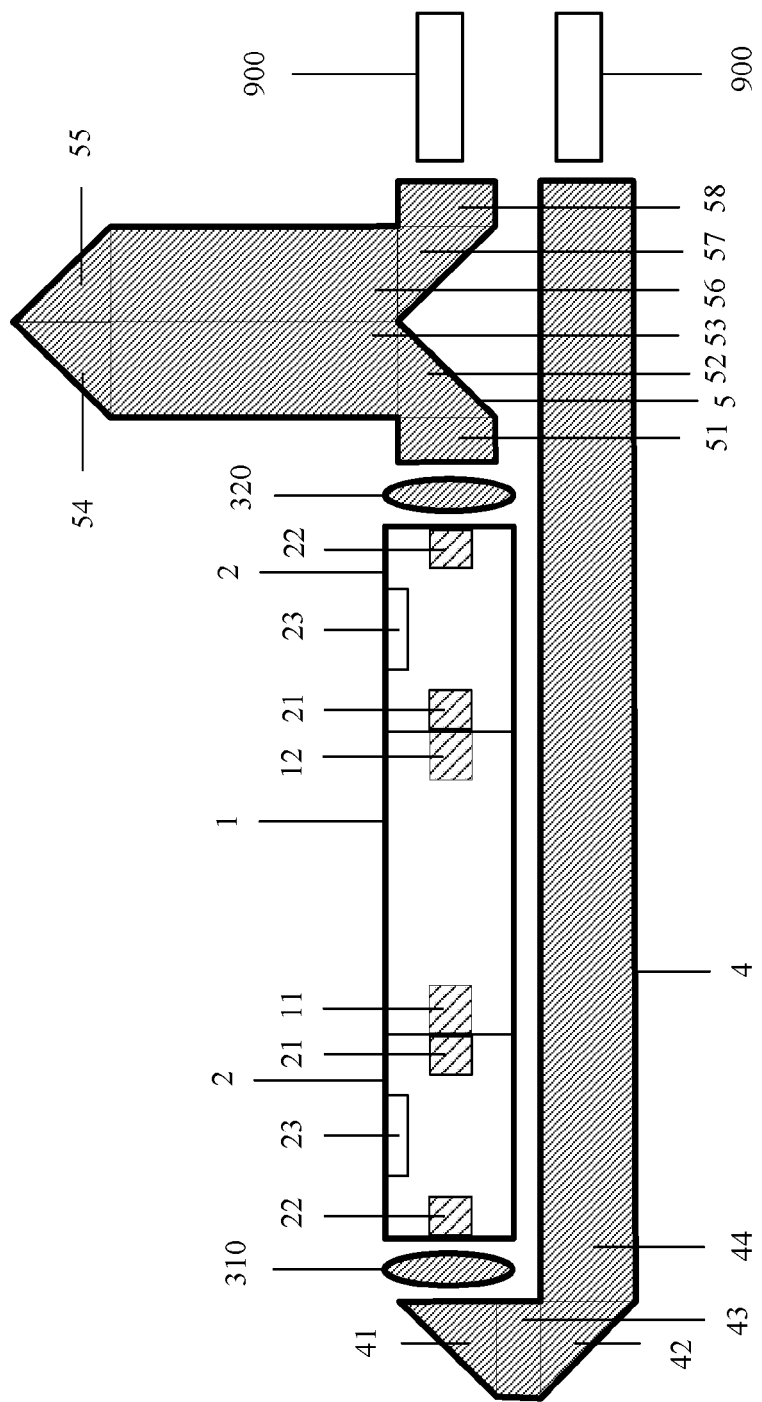
FIG. 4 is a schematic structural diagram of Embodiment 3 of an optical signal modulation apparatus according to the present invention.

FIG. 4 is a schematic structural diagram of Embodiment 3 of an optical signal modulation apparatus according to the present invention. As shown in FIG. 4, on the basis of the apparatus structure shown in FIG. 3, the apparatus in this embodiment may further include at least one optical path compensation component 5, and one optical path compensation component 5 is connected to an output end of an EAM connected to one second output end 12.

Each optical path compensation component 5 is configured to perform optical path compensation on one optical signal that is output at the second output end 12, so that a compensated optical signal is synchronized with the optical signal that is reflected by the optical reflection apparatus and that is output at the first output end.

It should be noted that FIG. 4 shows a structure of the optical signal modulation apparatus in which the laser includes one first output end, one second output end, and one optical reflection apparatus. If there is more than one second output end, a quantity of optical path compensation components 5 may be equal to a quantity of second output ends 12. Further, the optical signal obtained after the optical path compensation by at least one optical path compensation component 5 and the optical signal that is output by the EAM connected to the second output end 12 may be input to at least two fibers 900 for transmission, or may be input to one fiber for transmission.

For example, the optical path compensation component may include:
a third reflection prism, a fourth reflection prism, a fifth reflection prism, a sixth reflection prism, a third glass component, a fourth glass component, a fifth glass component, and a sixth glass component, where
the third glass component, the third reflection prism, the fourth glass component, the fourth reflection prism, the fifth reflection prism, the fifth glass component, the sixth reflection prism, and the sixth glass component are connected in sequence, the third glass component is connected to the output end of the EAM connected to the second output end, and the sixth glass component is configured to output the optical signal obtained after optical path compensation; and
a total length of a transmission path of an optical signal in the third reflection prism, the fourth reflection prism, the fifth reflection prism, the sixth reflection prism, the third glass component, the fourth glass component, the fifth glass component, and the sixth glass component is a sum of lengths of the laser and two EAMs.

Optionally, the third glass component 51, the fourth glass component 53, the fifth glass component 56, and the sixth glass component 58 may not be mandatory components. A vacuum part may be used to provide an optical channel, and a technical effect of the vacuum part is similar to that of a glass component. Details are not described herein.

Optionally, a convex lens 320 is disposed between an output end of an EAM connected to each second output end 12 and each optical path compensation component 5, and the convex lens 320 is configured to focus an optical signal that is output at the output end of the EAM connected to each second output end 12, and input the focused optical signal to a corresponding optical path compensation component 5.

According to the optical signal modulation apparatus in this embodiment of the present invention, at least one optical path compensation component is disposed, and one optical path compensation component is connected to an output end of an EAM connected to one second output end, so that a compensated optical signal is synchronized with an optical signal that is reflected by an optical reflection apparatus and that is output at a first output end. During optical signal propagation, this removes a fixed-length optical path difference generated because output ends of a laser are disposed on different sides of the laser.

Figure 5A:
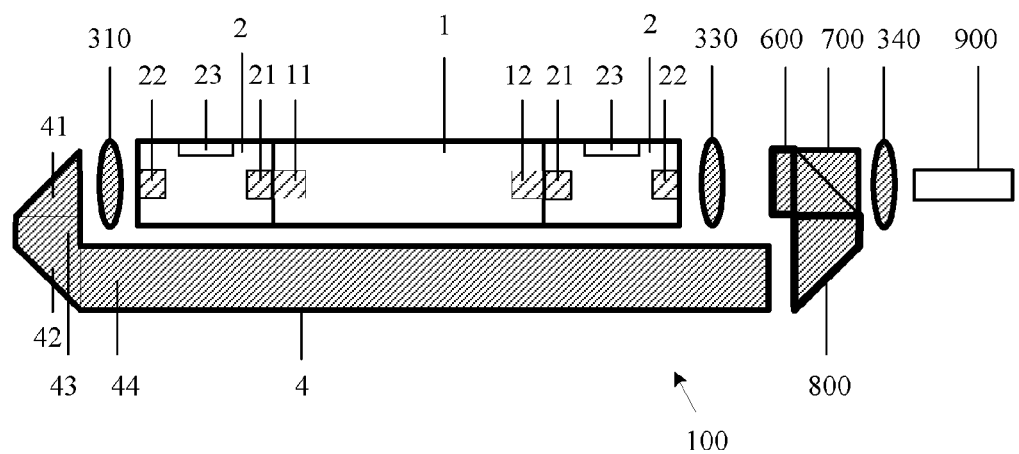
FIG. 5A is a schematic structural diagram of an embodiment of an optical signal modulation system according to the present invention.
Figure 5B:
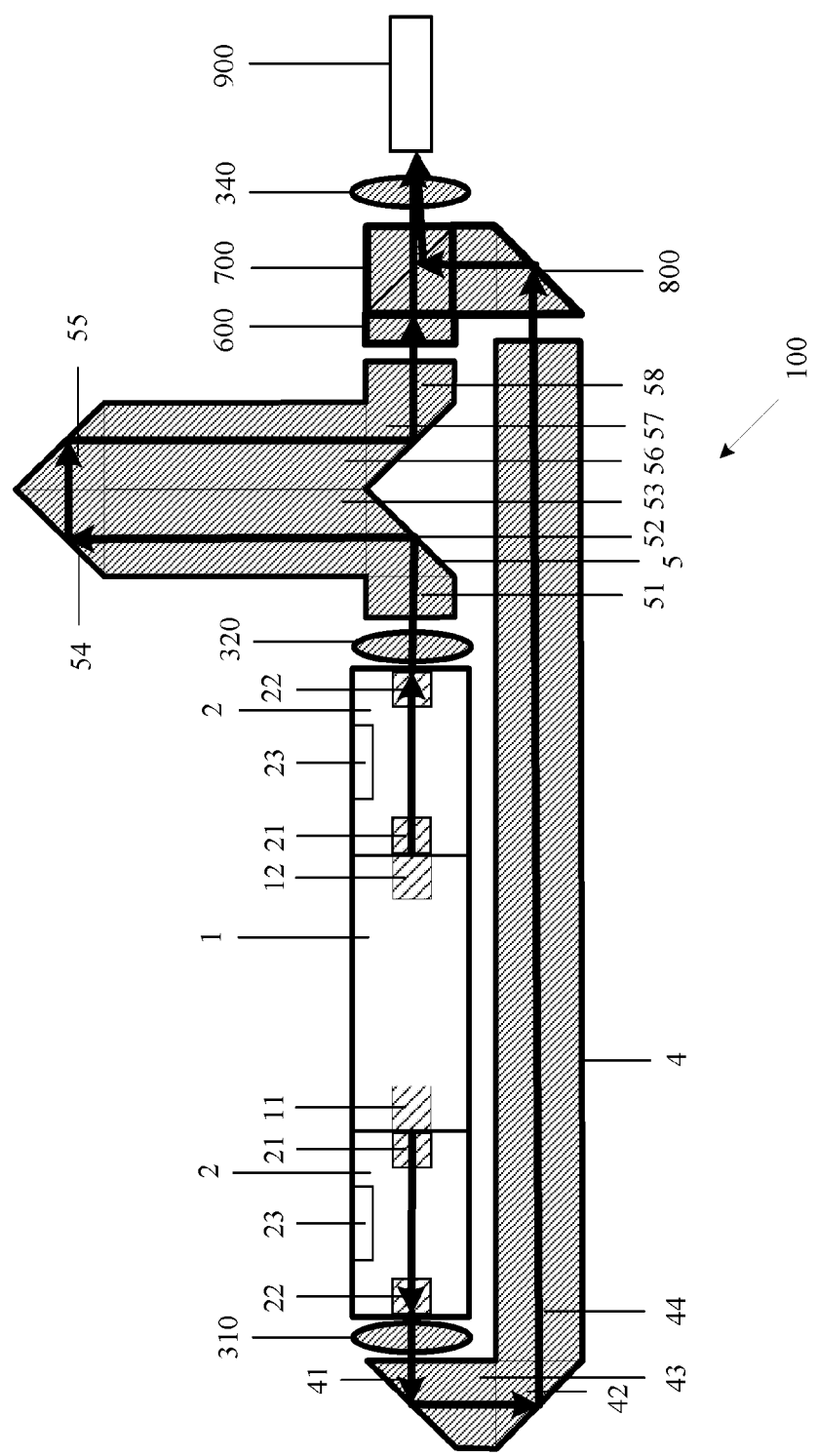
FIG. 5B is another schematic structural diagram of an embodiment of an optical signal modulation system according to the present invention.

FIG. 5A is a schematic structural diagram of an embodiment of an optical signal modulation system according to the present invention, and FIG. 5B is another schematic structural diagram of an embodiment of an optical signal modulation system according to the present invention. As shown in FIG. 5A, the system in this embodiment includes an optical signal modulation apparatus 100, an optical polarization rotator 600, and an optical polarization beam combiner (PBC) 700.

The optical signal modulation apparatus 100 (the left part shown in FIG. 5A) may use any one of the structures in the apparatus embodiments in FIG. 2A to FIG. 4, and is configured to generate at least two optical signals, and modulate each of at least two received electrical signals that carry channel data to one optical signal for outputting.

The optical polarization rotator 600 is configured to perform polarization rotation processing on at least one optical signal that is output by the optical signal modulation apparatus 100, and output a processed optical signal to the PBC 700, and the at least one optical signal is at least one of the at least two optical signals.

The PBC 700 is configured to combine the optical signal that is processed by the optical polarization rotator 600 and an optical signal that is not processed by the optical polarization rotator 600 and that is output by the optical signal modulation apparatus, and input the combined optical signal to a fiber 900.

Optionally, the system may further include:

a reflection prism 800, configured to reflect, to the PBC 700, the optical signal that is processed by the optical polarization rotator 600 or the optical signal that is not processed by the optical polarization rotator and that is output by the optical signal modulation apparatus 100.

Optionally, the system may further include a convex lens 340 connected to an output end of the optical polarization beam combiner, and the convex lens 340 is configured to focus at least two optical signals that are combined by the PBC 700, and input the focused optical signal to the target fiber 900. Optionally, there may be one or more target fibers 900.

It should be noted that when there is one target fiber 900, the optical signal modulation system provided in this embodiment of the present invention is actually a simple and reliable transmission apparatus for polarization multiplexing.

In an optical communications system, to reduce interference between channels, a quantity of wavelengths that can be used for transmitting optical signals is limited, and further, a quantity of optical signal channels is limited. In addition, an existing modulation rate has technical limitations. Therefore, in a scenario affected by the foregoing factors, a polarization multiplexing technology may further improve a transmission rate. In this technology, at a transmit end of an optical signal, polarization needs to be performed on one optical signal of two optical signals that have totally equal wavelengths and that carry channel data, so that the two optical signals have different vibration directions. Then the two optical signals are input to a fiber for transmission. At a receive end, depolarization multiplexing is performed on the two optical signals that have totally equal wavelengths but different vibration directions, resulting in two restored optical signals. However, this technology requires totally equal wavelengths of at least two optical signals that are sent at the transmit end; otherwise, if the at least two optical signals have different wavelengths, de-multiplexing at a receive end cannot be implemented.

Because the two optical signals generated by the optical signal modulation apparatus 100 in the optical signal modulation system in this embodiment of the present invention are generated by one laser, physical conditions for generating the two optical signals are exactly the same, and the two optical signals have totally equal wavelengths, the at least two optical signals that are output by the optical signal modulation apparatus in this embodiment of the present invention can be transmitted by using the polarization multiplexing technology.

As shown in FIG. 5A, for example, the optical signal modulation apparatus 100 includes one first output end 11 and one second output end 12, and the optical signal modulation apparatus 100 outputs two modulated optical signals. It may be gathered from the foregoing descriptions that the optical polarization rotator 600 may be connected to an output end of any one of the two optical signals. Preferably, for a compact system structure, the optical polarization rotator 600 may be connected to an output end of an EAM connected to the second output end 12 of the laser 1.

Further, the optical signal modulation system may further include at least one convex lens 330 disposed between an output end at which the optical signal modulation apparatus 100 outputs the at least one optical signal and the optical polarization rotator 600, and the at least one convex lens 330 is configured to focus the at least one optical signal that is output by the optical signal modulation apparatus 100, and input the focused optical signal to the optical polarization rotator 600. As shown in FIG. 5A, the optical signal modulation apparatus 100 includes one first output end 11 and one second output end 12, the optical signal modulation apparatus 100 outputs two modulated optical signals, and the convex lens 330 is configured to focus an optical signal that is output by the EAM connected to the second output end 12, and input the focused optical signal to the optical polarization rotator 600.

Optionally, the optical polarization rotator 600 may be a wave plate (wave plate), and the PBC 700 may include two prisms.

Optionally, an input end of the optical polarization rotator 600 may be connected to an output end of an EAM connected to the first output end 11, the reflection prism 800 is connected to an end at which the optical polarization rotator 600 outputs a polarized optical signal, and the PBC may be connected to an output end of an EAM connected to the second output end 12. This is not limited in the present invention. A technical principle and a technical effect are similar to those of the technical solution shown in FIG. 5A, and details are not described herein.

The following describes in detail an optical signal processing and propagation process in the optical signal modulation system in the present invention with reference to FIG. 5B.

As shown in FIG. 5B, the optical signal modulation system may include: an optical signal modulation apparatus 100, an optical polarization rotator 600, a PBC 700, a reflection prism 800, and a convex lens 320.

The optical signal modulation apparatus 100 may include one laser 1, two EAMs, one optical reflection apparatus 4, one optical path compensation component 5. The laser 1 has one first output end 11 and one second output end 12, and each of the first output end 11 and the second output end 12 is connected to one EAM 2. Each EAM has one optical signal input end 21, an optical signal output end 22, and an electrical signal input end 23. The optical signal modulation apparatus 100 may further include a convex lens 310 and the convex lens 320. The convex lens 310 is disposed between an output end of the EAM connected to the first output end 11 and the optical reflection apparatus 4. The convex lens 320 is disposed between an output end of the EAM connected to the second output end 12 and the optical path compensation component 5.

When the laser 1 generates at least two optical signals, the two optical signals separately enter the EAMs by using the first output end 11 and the second output end 12. Each EAM uses the electrical signal input end 23 to receive an electrical signal that carries channel data, and modulates the electrical signal to one received optical signal.

The EAM connected to the second output end 12 focuses a modulated optical signal by using the convex lens 320, and inputs the focused optical signal to the optical path compensation component 5. The EAM connected to the first output end 11 focuses a modulated optical signal by using the convex lens 310, and inputs the focused optical signal to the optical reflection apparatus 4. The optical signal that is output at the first output end 11 is reflected twice by the optical reflection apparatus 4, so that the reflected optical signal is in a same direction as the optical signal that is output at the second output end 12. The optical path compensation component 5 performs optical path compensation on the optical signal that is output at the second output end, and then a compensated optical signal enters the optical polarization rotator 600 for polarization processing. After the optical signal that is output at the first output end 11 is reflected by the optical reflection apparatus 4, the reflected optical signal is reflected again by the reflection prism 800 before entering the PBC. After the optical polarization rotator 600 performs polarization processing on the optical signal that is output at the second output end, a polarized optical signal enters the PBC. The PBC performs optical combination on the two optical signals, and a combined optical signal is focused by the convex lens 340 and input to a fiber 900 for transmission. So far, steps for transmitting an optical signal by using a polarization multiplexing method are complete. Because the two optical signals generated by the laser have totally equal wavelengths, a receive end device may perform depolarization multiplexing on the two optical signals, to implement the polarization multiplexing technology.

The optical signal modulation system provided in this embodiment of the present invention includes an optical signal modulation apparatus, an optical polarization rotator, and an optical polarization beam combiner. The optical signal modulation apparatus includes:

a laser, where each of at least one first output end and at least one second output end of the laser is connected to an electro-absorption modulator EAM, the first output end of the laser is disposed on one side of the laser, and the second output end is disposed on the other side of the laser;

the laser is configured to generate at least two optical signals, where at least one of the optical signals is sent to at least one EAM by using the at least one first output end, and at least one of the optical signals is sent to at least one EAM by using the at least one second output end; and each EAM is configured to receive one electrical signal that carries channel data, receive one of the optical signals sent by the laser, and modulate the received electrical signal onto the received optical signal for outputting.

First, because all optical signals use one laser, that is, are generated by a same optical source, and all the optical signals have totally equal wavelengths, all the optical signals generated by using this apparatus structure can be used to implement polarization multiplexing.

Further, the at least one first output end and the at least one second output end are separately disposed on two sides of the laser, so that the laser, the same optical source, can generate at least two optical signals without using a complex splitting structure. For example, when a simple quantum well laser is used to generate an optical signal in an activation manner, because both sides of the laser can transmit an optical signal, an output end used for transmitting optical signal is disposed on either end of the laser, so that a structure of the laser may be fully used to output at least two optical signals for polarization multiplexing, a complex splitting structure is avoided in the laser or in the optical signal modulation apparatus, and the generated at least two optical signals have totally equal wavelengths.

In addition, each of EAMs connected to the at least one first output end and the at least one second output end receives one optical signal and one electrical signal, and modulates the electrical signal to the optical signal, so that an electrical signal that carries channel data is loaded onto an optical signal. Then an optical polarization rotator is used to perform polarization processing on at least one of the optical signals, to obtain optical signals that carry channel data and that can be combined, by polarization multiplexing, to a fiber for transmission. Finally, the optical signal that passes the optical polarization rotator and an optical signal that does not pass the optical polarization rotator are combined and input to a fiber by using an optical polarization beam combiner. Therefore, the system in this embodiment of the present invention can transmit an optical signal by complete polarization multiplexing.

The optical signal modulation apparatus configured to generate optical signals that have equal wavelengths has a very simple structure, so that the system in this embodiment of the present invention has relatively low power consumption. In addition, the simple structure reduces production process steps, and further reduces costs of the entire transmission system. Therefore, the system in this embodiment of the present invention provides an easily generated polarization multiplexing transmission apparatus with a simple structure and low costs.

Still further, in this embodiment of the present invention, the optical signal modulation system for polarization multiplexing outputs polarization multiplexing optical signals with highly matched and stable wavelengths. Optical signals with lowly matched and unstable wavelengths are not generated because multiple used optical sources have different aging degrees, or costs, power consumption, stability or other problems are avoided because another wavelength matching apparatus for other purposes is used to generate polarization multiplexing optical signals. Therefore, in this embodiment of the present invention, the optical signal transmission apparatus for polarization multiplexing in the optical signal modulation system not only has a simple structure, low power consumption, and reduced costs, but also can implement polarization multiplexing transmission with relatively high wavelength matching accuracy.

Persons of ordinary skill in the art may understand that all or some of the steps of the method embodiments may be implemented by a program instructing relevant hardware. The program may be stored in a computer readable storage medium. When the program runs, the steps of the method embodiments are performed. The foregoing storage medium includes: any medium that can store program code, such as a read-only memory (ROM), a random access memory (RAM), a magnetic disk, or an optical disc.

Finally, it should be noted that the foregoing embodiments are merely intended for describing the technical solutions of the present invention, but not for limiting the present invention. Although the present invention is described in detail with reference to the foregoing embodiments, persons of ordinary skill in the art should understand that they may still make modifications to the technical solutions described in the foregoing embodiments or make equivalent replacements to some or all technical features thereof, without departing from the scope of the technical solutions of the embodiments of the present invention. Additionally, statements made herein characterizing the invention refer to an embodiment of the invention and not necessarily all embodiments.

What is claimed is:

1. An optical signal modulation apparatus, comprising:
a laser, wherein each of at least one first output end and at least one second output end of the laser is connected to an electro-absorption modulator (EAM), the at least one first output end of the laser is disposed on one side of the laser, and the at least one second output end is disposed on another side of the laser; and at least one optical reflection apparatus, wherein an optical reflection apparatus is connected to an output end of an EAM connected to a first output end;

wherein the laser is configured to generate at least two optical signals, wherein at least one of the at least two optical signals is sent to at least one EAM by using the at least one first output end, and at least one of the at least two optical signals is sent to at least one EAM by using the at least one second output end;

wherein each EAM is configured to receive an electrical signal that carries channel data, receive an optical signal sent by the laser, and modulate the received electrical signal onto the received optical signal for outputting; and wherein the optical reflection apparatus is configured to reflect an optical signal that is output at the first output end so that the reflected optical signal is in a same direction as an optical signal that is output at a second output end.

2. The modulation apparatus according to claim 1, wherein the optical reflection apparatus comprises a first reflection prism and a second reflection prism;

wherein the first reflection prism is configured to reflect, to the second reflection prism, the optical signal that is output at the first output end; and wherein the second reflection prism is configured to reflect the optical signal reflected by the first reflection prism so that the optical signal reflected by the second reflection prism is in the same direction as the optical signal that is output at the second output end.

3. The modulation apparatus according to claim 2, wherein the optical reflection apparatus further comprises a first glass component and a second glass component;

wherein the first glass component is configured to provide an optical channel between the first reflection prism and the second reflection prism; and wherein the second glass component is configured to output the optical signal reflected by the second reflection prism.

4. The modulation apparatus according to claim 1, further comprising:

at least one optical path compensation component, wherein an optical path compensation component is connected to an output end of an EAM connected to the second output end, and the optical path compensation component is configured to perform optical path compensation on the optical signal that is output at the second output end so that a compensated optical signal is synchronized with the reflected optical signal that is output by the optical reflection apparatus.

5. The modulation apparatus according to claim 4, wherein the optical path compensation component comprises:

a third reflection prism, a fourth reflection prism, a fifth reflection prism, a sixth reflection prism, a third glass component, a fourth glass component, a fifth glass component, and a sixth glass component;

wherein the third glass component, the third reflection prism, the fourth glass component, the fourth reflection prism, the fifth reflection prism, the fifth glass component, the sixth reflection prism, and the sixth glass component are connected in sequence, the third glass component is connected to the output end of the EAM connected to the second output end, and the sixth glass component is configured to output the optical signal obtained after optical path compensation; and wherein a total length of a transmission path of an optical signal in the third reflection prism, the fourth reflection prism, the fifth reflection prism, the sixth reflection prism, the third glass component, the fourth glass component, the fifth glass component, and the sixth glass component is a sum of lengths of the laser and two EAMs.

6. The modulation apparatus according to claim 1, wherein a convex lens is disposed between each output end of each EAM connected to each first output end and each optical reflection apparatus, and each convex lens is configured to focus a respective optical signal that is output at the respective output end of the respective EAM connected to the respective first output end, and input the focused optical signal to a respective corresponding optical reflection apparatus.

7. The modulation apparatus according to claim 1, wherein a convex lens is disposed between each output end of the laser and each corresponding EAM, and each convex lens is configured to focus a respective optical signal that is output at the respective output end of the laser, and input the focused optical signal to the respective corresponding EAM.

8. An optical signal modulation system, comprising:
an optical signal modulation apparatus comprising:
a laser, wherein each of at least one first output end and at least one second output end of the laser is connected to an electro-absorption modulator (EAM), the at least one first output end of the laser is disposed on one side of the laser, and the at least one second output end is disposed on another side of the laser opposite to the one side of the laser; and
at least one optical reflection apparatus, wherein an optical reflection apparatus is connected to an output end of an EAM connected to a first output end;
wherein the laser is configured to generate at least two optical signals, wherein at least one of the at least two optical signals is sent to at least one EAM by using the at least one first output end, and at least one of the at least two optical signals is sent to at least one EAM by using the at least one second output end;
wherein each EAM is configured to receive an electrical signal that carries channel data, receive an optical signal sent by the laser, and modulate the received electrical signal onto the received optical signal for outputting; and
wherein the optical reflection apparatus is configured to reflect an optical signal that is output at the first output end so that the reflected optical signal is in a same direction as an optical signal that is output at a second output end;
an optical polarization rotator; and
an optical polarization beam combiner (PBC);
wherein the optical polarization rotator is configured to perform polarization rotation processing on at least one optical signal that is output by the optical signal modulation apparatus, and output a processed optical signal to the PBC, wherein the at least one optical signal corresponds to at least one of the at least two optical signals; and
wherein the PBC is configured to combine the at least one optical signal that is processed by the optical polarization rotator and an optical signal that is not processed by the optical polarization rotator and that is output by the optical signal modulation apparatus, and input the combined optical signal to a fiber.

9. The modulation system according to claim 8, further comprising at least one convex lens, disposed between an output end at which the optical signal modulation apparatus outputs the at least one optical signal and the optical polarization rotator, wherein each convex lens is configured to focus a respective optical signal that is output by the optical signal modulation apparatus, and input the focused optical signal to the optical polarization rotator.

10. The modulation system according to claim 8, further comprising:
    a reflection prism, configured to reflect, to the PBC, the at least one optical signal that is processed by the optical polarization rotator or the optical signal that is not processed by the optical polarization rotator and that is output by the optical signal modulation apparatus.

* * * * *